United States Patent [19]

Ito

[11] Patent Number: 5,834,814
[45] Date of Patent: Nov. 10, 1998

[54] SEMICONDUCTOR INTEGRATED CIRCUIT

[75] Inventor: Takao Ito, Tokyo, Japan

[73] Assignee: Kabushiki Kaisha Toshiba, Kawasaki, Japan

[21] Appl. No.: 459,468

[22] Filed: Jun. 2, 1995

[30] Foreign Application Priority Data

Aug. 19, 1994 [JP] Japan .................................. 6-195014

[51] Int. Cl.⁶ .............................................. H01L 29/70
[52] U.S. Cl. .......................... 257/378; 257/379; 257/577; 257/557; 257/566
[58] Field of Search .................................. 257/557, 560, 257/563, 564, 539, 552, 273, 566, 574, 575, 593, 368, 378, 379, 561, 562, 565, 577

[56] References Cited

U.S. PATENT DOCUMENTS

| | | | |
|---|---|---|---|
| 4,929,884 | 5/1990 | Bird et al. | 323/313 |
| 5,081,517 | 1/1992 | Contiero et al. | 257/557 |
| 5,155,385 | 10/1992 | Gotoh et al. | 327/562 |
| 5,444,362 | 8/1995 | Chung et al. | 323/313 |
| 5,572,114 | 11/1996 | Ichimaru | 323/315 |

FOREIGN PATENT DOCUMENTS

| | | |
|---|---|---|
| 93086 | 11/1983 | European Pat. Off. |
| 4225238 | 8/1992 | Japan |

Primary Examiner—David B. Hardy
Attorney, Agent, or Firm—Finnegan, Henderson, Farabow, Garrett & Dunner, L.L.P.

[57] ABSTRACT

A current mirror circuit comprises first and second lateral-type bipolar transistors having first and second conductive films each formed via an insulation film, on the portion of the surface of a base region between an emitter region and a collector region. The first and second emitter regions and the first and second collector regions formed in the surface region of the base region separately from each other. A diode is used as a bias circuit. The diode applies a bias voltage corresponding to the output current of the first transistor, that is, the reference current, to the first and second conductive films of the first and second transistors, so that the width of the channel formed in a base region is changed in accordance with the reference current, and therefore the current amplification rate of each transistor can be maintained at a high value even if a large operation current is supplied.

18 Claims, 5 Drawing Sheets

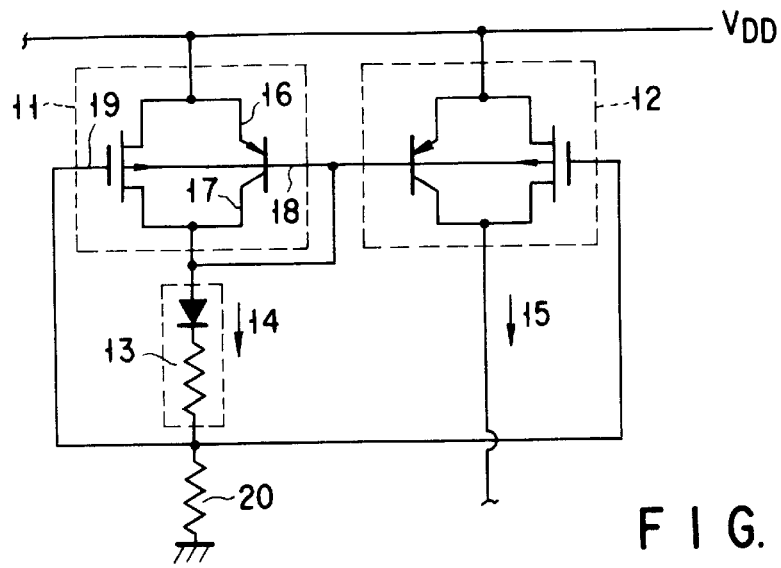
F I G. 4
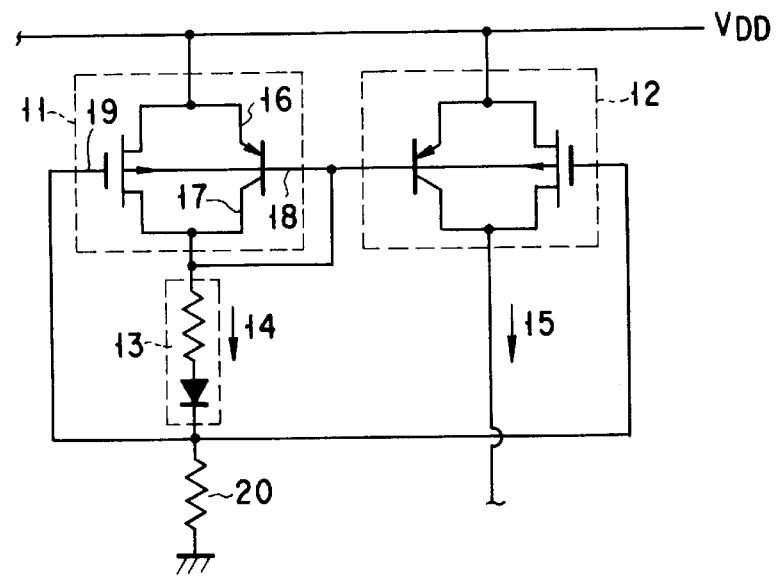
F I G. 5
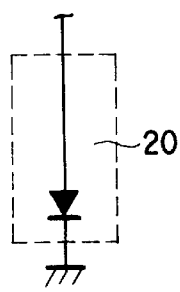
F I G. 6
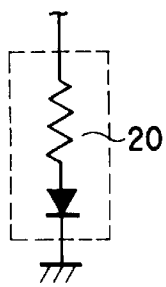
F I G. 7
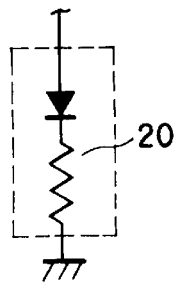
F I G. 8

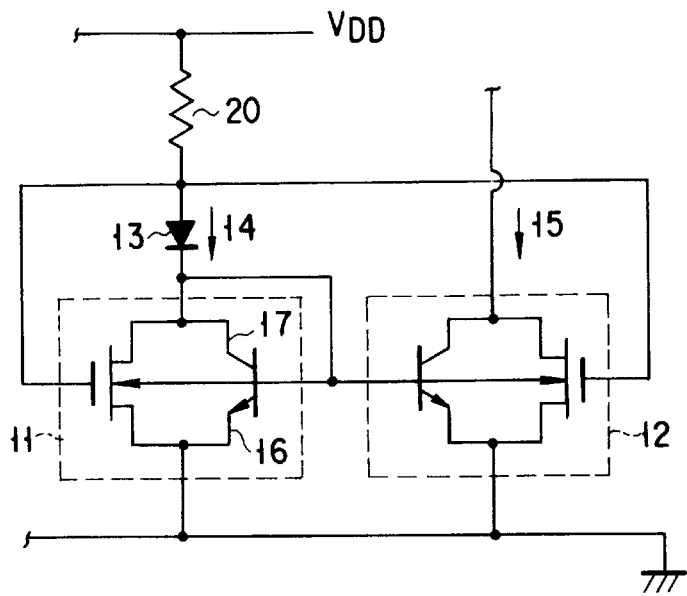
F I G. 9
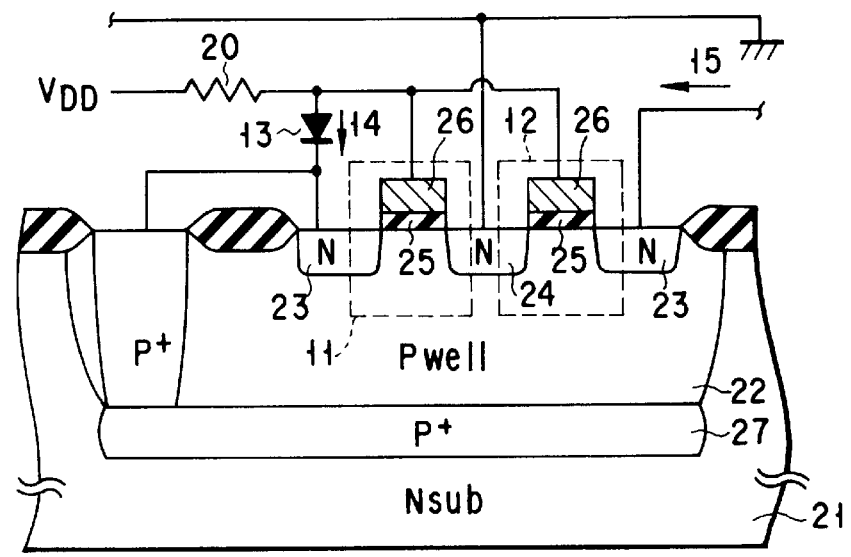
F I G. 10

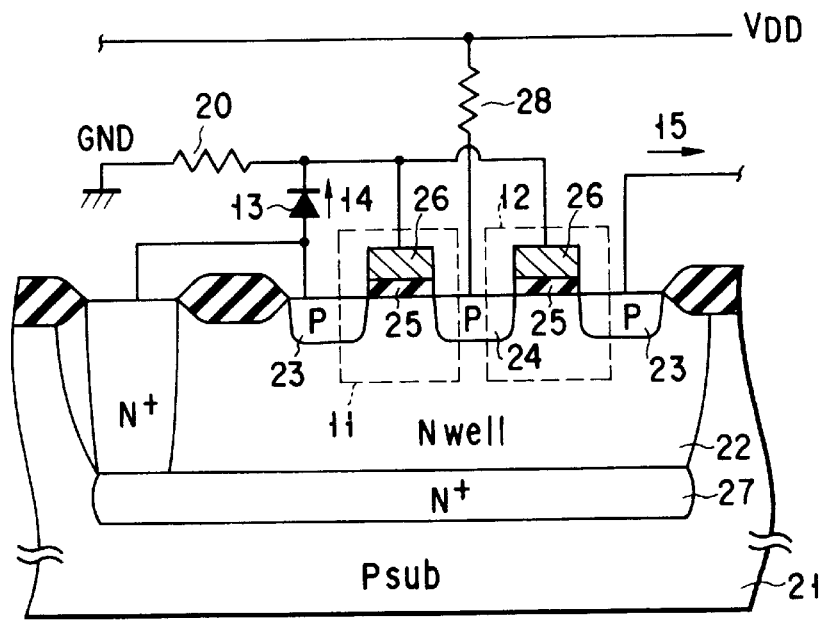
F I G. 11
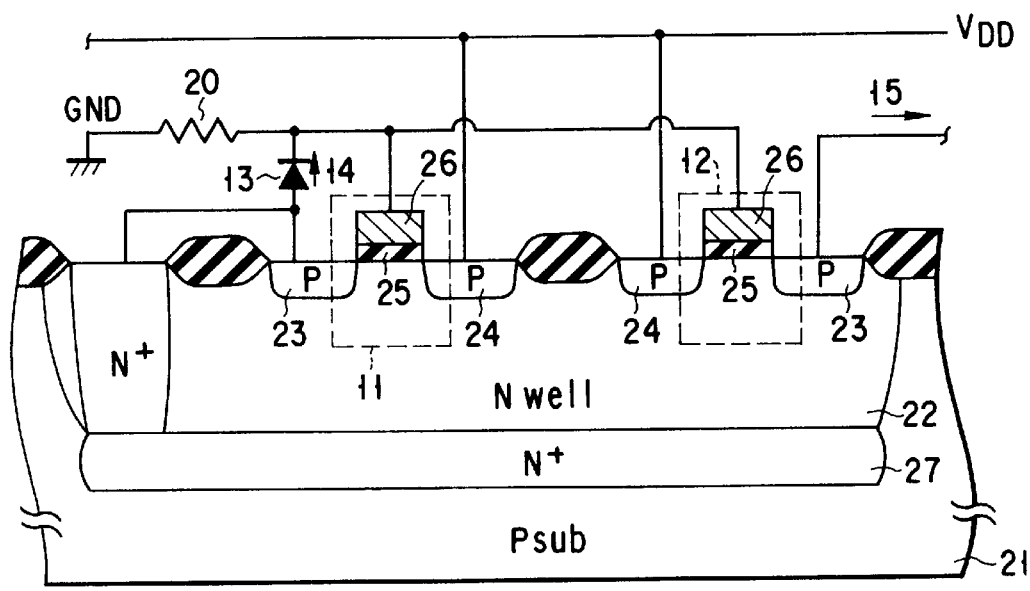
F I G. 12

SEMICONDUCTOR INTEGRATED CIRCUIT

BACKGROUND OF THE INVENTION

1. Field of the Invention

The present invention relates to a semiconductor integrated circuit, and more specifically to a type having a current mirror circuit as a constant current source circuit.

2. Description of the Related Art

Conventionally, a constant current source circuit is used in an analog circuit in many cases. A current mirror circuit is known was a typical example of the constant current source circuit. There are two types of the current mirror circuit, one in which an electrical field effect type transistor (to be abbreviated as FET hereinafter) is used and another in which a bipolar transistor is used.

A typical example of the type in which an FET is used has a structure as shown in FIG. 13, in which a gate terminal of an FET 31 for setting a reference current 33 and a gate terminal of an FET 32 for current source are connected with each other. The gate electrode of the FET 31 is connected to a drain terminal thereof, and a back gate and a source terminal thereof are connected to a power source $V_{DD}$. An output current 34 of the FET 32 is used as the current source.

The ratio between the output currents from the FETs 31 and 32, which is a numerical value representing the performance of the current mirror circuit, (to be called as mirror coefficient hereinafter) should preferably be close to 1. In order to render the mirror coefficient close to 1, it is necessary to realize elements which have the identical electrical characteristics as two FETs, and reduce a drain voltage dependency with regard to the output current. FIG. 14 shows an example of the drain voltage dependency of the mirror coefficient. According to this figure, it is required that the drain voltage should be equal to or larger than a certain level (about 3.5V in the example shown in FIG. 4), in order to render the mirror coefficient close to 1. This is because a change in drain voltage has a great influence on a channel length, and therefore the drain voltage has a great influence on the output current. In order to reduce the drain voltage dependency of the mirror coefficient, it is necessary, for example, to increase the element size of the FET or to provide a compensation circuit.

With regard to the current mirror circuit in which a conventional FET is used, it is necessary to increase the number of elements or the element size for enhancement of the performance, which creates problems in terms of the reduction or miniaturization of the element size, or the integration.

A typical example of a current mirror circuit in which a bipolar transistor is used has a structure shown in FIG. 15, in which a base terminal of a transistor 51 for setting a reference current 53 and a base terminal of a transistor 52 for extracting an output current are connected with each other, the base terminal of the reference current setting transistor 51 is connected to a collector terminal, and an emitter terminal thereof is connected to a power source $V_{DD}$. An output current 54 of the transistor 52 is used as the current source.

In similar to the case of the FET, it is preferable that the ratio (mirror coefficient) of the output currents of the transistors should be as close to 1 as possible. The current amplification rate of a transistor is determined by the ratio between the collector current and the base current. As the value of the current amplification rate is lower, the collector current is more easily influenced by a change in the base current. Further, in the case where the current amplification rate is low, the difference in output current between two transistors becomes large, thus decreasing the mirror coefficient. Therefore, it is preferable that a transistor having a high current amplification rate should be used in the current mirror circuit. In order to achieve this, a compensation circuit is provided for suppressing an influence of the collector current due to a change in the base current, to a low level. However, the number of elements is increased as a result, creating the problem of the integration.

SUMMARY OF THE INVENTION

The present invention has been proposed in the above-described circumstances, and the object thereof is to provide a semiconductor device having a current mirror circuit having a high mirror efficient, which has a small number of elements, and does not require a compensation circuit.

Recently, there have been intensive studies on an element of a constitution, in which a MOS (metal oxide silicon) structure is formed on the portion of the surface of a semiconductor substrate which is for a lateral-type bipolar transistor to be formed, and a high current amplification rate can be obtained by applying a predetermined voltage to its metal electrode. A structure of such an element is disclosed in Jap. Pat. Appln. KOKAI Publication No. 63-136669 or Jap. Pat. Appln. KOKAI Publication No. 6-13396. The semiconductor device disclosed in these Jap. Pat. Appln. KOKAI Publications has a structure including a lateral-type transistor in which a semiconductor substrate is used as a base region and an emitter region and a collector region of a conductivity type opposite to that the base region are provided in parallel, and a conductive film is formed via an insulation film on the portion of the surface of the semiconductor surface, which corresponds to the base region located between the emitter region and the collector region. Then, a channel is formed on a portion of the conductive film by applying such a potential that reverses the conductivity type of the base region, to the conductive film, so as to achieve a high current amplification rate.

The present invention utilizes the lateral type bipolar transistor having the structure described above, and more specifically uses a lateral type bipolar transistor having structure in which a conductive film is formed via an insulation film on the portion of a semiconductor substrate, which corresponds to the base region between the emitter region and the collector region, so as to form a current mirror circuit. Further, according to the structure of the present invention, a bias voltage corresponding to the reference current of the current mirror circuit is applied to the conductive film of each of the transistors, and thus the width of the channel region is changed in accordance with the reference current. More specifically, in the case where a high reference current is applied, the bias voltage is increased, and therefore the width of the channel region is increased. With this structure, a sufficiently high current amplification rate can be maintained even if the operation current is increased in each transistor, and therefore a current mirror circuit having a high mirror coefficient as compared to that of the conventional technique, and capable of handling a high current, can be provided.

In the present invention, the current mirror circuit is made of first and second lateral-type bipolar transistors having first and second conductive films each formed via an insulation film, on the portion of the surface of a base region between an emitter region and a collector region. The emitter region and the first and second collector regions are formed in the surface region of the base region and separated from each other. The bias voltage corresponding to the output current of the first transistor, that is, the reference current, is applied to the first and second conductive films of the first and second transistors.

With the present invention, the width of the channel formed in a base region is changed in accordance with the reference current, and therefore the current amplification rate of each transistor can be maintained at a high value even if a large operation current is supplied. With this constitution, the influence of the base current can be substantially neglected and therefore the mirror coefficient can be raised. Further, the number of elements is small since no compensation circuit or the like is required. Thus, a current mirror circuit having a further high current driving performance, can be obtained.

According to the present invention, there is provided a semiconductor integrated circuit having a current mirror circuit, the current mirror circuit comprising: first and second lateral type bipolar transistors having a base region of a first conductivity type, an emitter region of a second conductivity type, formed in a surface region of the base region, first and second collector regions of the second conductivity type, formed in the surface region of the base region separately from the emitter regions, and first and second conductivity films, formed on the surface region of the base region located between the emitter region and the first and second collector regions, each via an insulation film; and means for applying a bias voltage corresponding to an output current of the first transistor to the first and second conductive films of the first and second transistors, and controlling an output current of the second transistor; wherein the output current of the first transistor is used as a reference current and the output current of the second transistor is used as a current source.

According to the present invention, there is further provided a semiconductor integrated circuit having a current mirror circuit, the current mirror circuit comprising first and second bipolar transistors having a base region of a first conductivity type, an emitter region of a second conductivity type, formed in a surface region of the base region, and first and second collector regions of the second conductivity type, formed in the base region separately from the emitter regions, one of the emitter region and the collector region of each of the first and second transistors constituting an input terminal, and the other constituting an output terminal, means connecting the output terminal of the first transistor to the base region of the first transistor, means for providing an output of the first transistor as a reference current, and means for providing an output of the second transistor as a current source, wherein first and second conductive films are formed each via an insulation film on the surface region of the base region located between the emitter region and the collector region of each of the first and second transistors.

According to the present invention, there is still further provided a semiconductor integrated circuit having a current mirror circuit, comprising: a first region of a first conductivity type, formed in a semiconductor substrate of a second conductivity type, from a surface of the semiconductor substrate; a second region of the second conductivity type, formed in a surface region of the first region; a third region of the second conductivity type, formed in the surface region of the first region; a fourth region of the second conductivity type, formed in the surface region of the first region between the second and third regions separately from the second and third regions; a first conductive film formed between the second and fourth regions and on the surface of the semiconductor substrate, via a first insulation film; a second conductive film formed between the third and fourth regions and on the surface of the semiconductor substrate, via a second insulation film; a first load element; a second load element; first wiring connecting the second region to the first region; second wiring connecting the first wiring to an input terminal of the first load element; third wiring connecting an output terminal of the first load element to an input terminal of the second load element; fourth wiring connecting an output terminal of the second load element to an output voltage; fifth wiring connecting the output terminal of the first load element to the first conductive film; sixth wiring connecting the output terminal of the second load element to the first conductive film; seventh wiring connecting the fourth region to an input voltage; and eighth wiring connected to the third region.

According to the present invention, there is yet further provided a semiconductor integrated circuit comprising: a first transistor circuit constituted of a first bipolar transistor and a first field effect transistor connected in parallel with each other, having a first current terminal, a second current terminal, a back bias terminal and a gate terminal, the first current terminal being connected to a power supply node, and the back bias terminal being connected to the second current terminal, a second transistor circuit constituted of a second bipolar transistor and a second field effect transistor connected in parallel with each other, having a first current terminal, a second current terminal, a back bias terminal and a gate terminal, the first current terminal of the second transistor circuit being connected to the power supply node, and the back bias terminal of the second transistor circuit being connected to the back bias terminal of the first transistor circuit, and a bias element connected between the second current terminal of the first transistor circuit and the gate terminal of the first transistor circuit and between the second current terminal of the first transistor circuit and the gate terminal of the second transistor circuit, for supplying a bias voltage corresponding to an output current of the first transistor circuit to the gate terminals of the first and the second transistor circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a diagram showing another partially different version of the circuit shown in FIG. 1;

FIG. 5 is a diagram showing still another partially different version of the circuit shown in FIG. 1;

FIG. 6 is a diagram showing a partially different version of a portion of the circuit shown in FIG. 1;

FIG. 7 is a diagram showing another partially different version of the portion of the circuit shown in FIG. 1;

FIG. 8 is a diagram showing still another partially different version of the portion of the circuit shown in FIG. 1;

FIG. 9 is a diagram showing a current mirror circuit according to another embodiment of the present invention;

FIG. 10 is a cross section showing the structure of the current mirror circuit shown in FIG. 9;

FIG. 11 is a diagram showing the structure of a current mirror circuit according to still another embodiment of the present invention;

FIG. 12 is a diagram showing the structure of a current mirror circuit according to a further embodiment of the present invention;

DETAILED DESCRIPTION OF THE PREFERRED EMBODIMENTS

Figure 1:
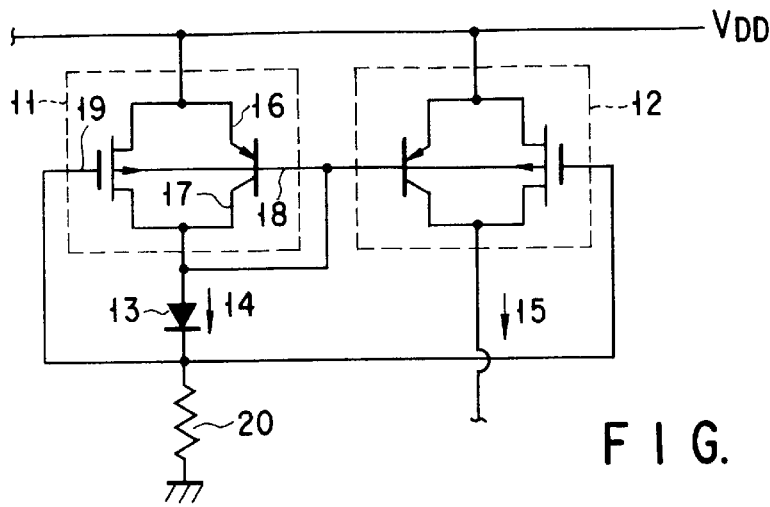
FIG. 1 is a diagram showing a current mirror circuit according to an embodiment of the present invention.

FIG. 1 is a circuit diagram equivalent to that of a current mirror circuit according to an embodiment of the present invention. Conventionally, in the case where a current mirror circuit is made of an FET or a bipolar transistor, the back gate electrode of the transistor element is connected to a power potential or a ground potential. In a bipolar transistor element of the current mirror circuit of the present invention, since the transistor is equivalent used in combination with an FET, the back gate of the FET is connected to the back gate of the bipolar transistor. In FIG. 1, the transistor element is represented by the combination of the symbol of the FET and the symbol of the bipolar transistor. Further, in the following description, the semiconductor regions are called a collector region, an emitter regions, and a base region. A conductive film formed on the base region positioned between the collector and emitter regions, is called a gate electrode.

In the current mirror circuit according to the embodiment of the present invention, base terminals 18 of two lateral type PNP bipolar transistor 11 and 12 are connected to each other, and emitter terminals 16 of the transistors 11 and 12 are connected to a power source $V_{DD}$. A collector terminal 17 of the transistor 11 for setting a reference current is connected to the base terminal 18 and the potential of the collector terminal 17 is equal to that of the base terminal 18. The gate electrodes 19 of the transistors 11 and 12 are connected to a cathode of a diode 13 connected to the collector terminal 17 of the transistor 11, and the potential of the gate electrodes 19 is equal to that of the cathode. An anode of the diode 13 is connected to the collector terminal 17 of the transistor 11. With this structure, the potential difference between the collector terminal 17 and the gate electrode 19 of the transistor 11 varies generally within a range of about 0.7 to 0.8V in accordance with a desired current value of a reference current 14. An output current 15 of the transistor 12 is used as a current source for the current mirror circuit.

The reason for connecting the anode of the diode 13 to the collector terminal 17 of the transistor 11, and the cathode to the gate electrodes 19 of the transistors 11 and 12, is to apply the bias current, which controls the width of the channel formed in the base region of each of the transistors 11 and 12, in accordance with the current value of the reference current 14 flowing through the transistor 11. As the current value 14 varies, the voltage drop at the diode 13 varies; therefore the bias voltage applied to the gate electrode varies in accordance with the current value of the reference current 14. In accordance with the variation of the reference current 14, the width of the channel formed in the base region of each transistor is increased or decreased, and therefore a channel having a width corresponding to the current value of the reference current 14 is formed.

Figure 3:
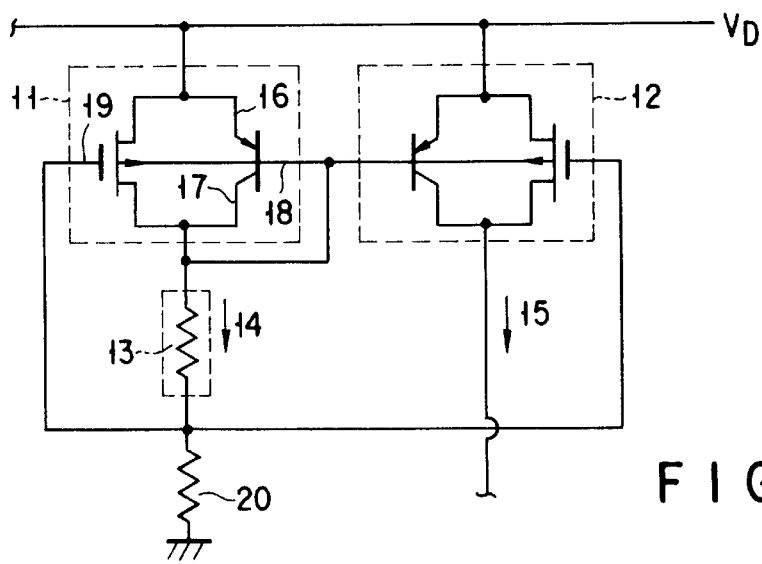
FIG. 3 is a diagram showing a partially different version of the circuit shown in FIG. 1.
Figure 13:
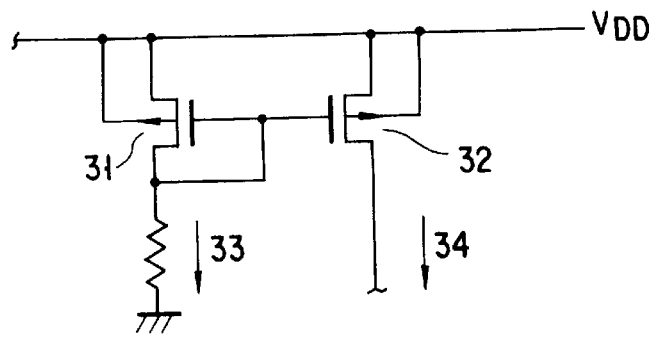
FIG. 13 is a diagram showing a conventional current mirror circuit.
Figure 14:
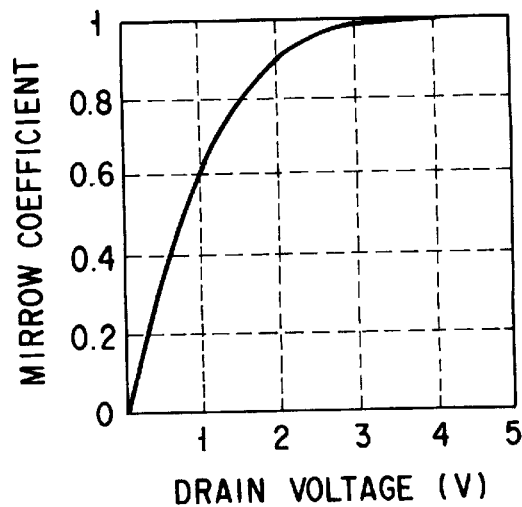
FIG. 14 is a diagram showing the drain voltage-mirror coefficient characteristic curve of the current mirror circuit.
Figure 15:
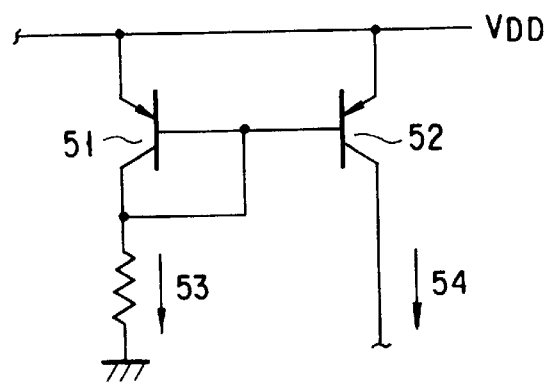
FIG. 15 is a diagram showing another example of the conventional current mirror circuit.

As bias means for the gate electrode, a resistance element having a such value that the voltage drop is about 0.5 to 1.0V is used in place of the diode 13 as shown in FIG. 3, so that the bias voltage corresponding to the reference current 14 is applied to the gate electrode. Further, as shown in FIG. 4 and FIG. 5, a diode and a resistance can be used in combination. The resistance 20 is used to generate the reference current 14, and may be, apart from a resistance, a load element such as an diode or transistor, or a combination of these elements. FIG. 6 shows an example in which a diode is used in place of a resistance and each of FIGS. 7 and 8 shows an example in which a resistance and a diode are used in combination.

According to the present invention, a transistor is used which has a gate electrode on the base region of a lateral type bipolar transistor having a current amplification rate of about 50k, and a bias voltage corresponding to the reference current of the current mirror circuit is applied to the gate electrode. Therefore, a high current amplification rate can be achieved even in a large operation current. Thus, in the case where the current amplification rate of the transistor is 50k, the mirror coefficient is about 0.9996 even in a region having a large reference current.

With the above structure, a compensation circuit designed for the improvement of the mirror coefficient of the current mirror circuit, conventionally used to maintain a current amplification rate of the transistor to be high, becomes unnecessary, and therefore the number of elements constituting the circuit can be reduced. Further, as compared to the conventional case where the circuit is formed of an FET, the current driving performance is significantly improved since the saturation tendency of the current amplification rate is low especially in the large operation current region. Further, since it is not necessary to consider the drain voltage dependency of the mirror coefficient, the present invention can be used even in the region of a low operation voltage, and the element size can be reduced. Further, as compared to the case of the conventional technique, where a plurality of transistors are connected in parallel so as to form one current mirror circuit for the purpose of maintaining a large current, an improved current driving performance can be achieved by the embodiment of the present invention. Therefore, a large current can be handled up to a certain high level without having such a parallel connection of a plurality of transistors, and therefore the number of elements can be reduced. In order to obtain a further large current, naturally, it is possible to use a plurality of transistors connected in parallel.

Figure 2:
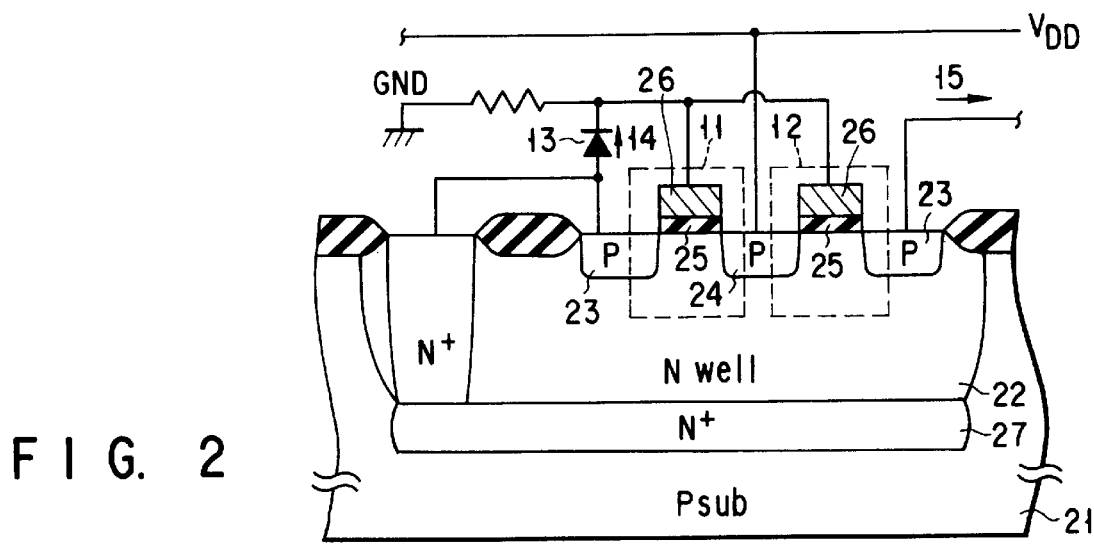
FIG. 2 is a cross section showing the structure of the current mirror circuit shown in FIG. 1.

FIG. 2 is a cross section showing the current mirror circuit of the present invention. As shown in this figure, the current mirror circuit of the present invention has the following structure. That is, an N-type well region formed in a P-type semiconductor substrate 21 is used as a base region 22. Two P-type collector regions 23 and a P-type emitter region 24, (of a conductivity type opposite to that of the base region 22) are formed on the surface region in the well region separately from each other. Further, a gate electrode 26 is formed via an insulation film 25 on each of portions of the base region 22 located between each of the collector regions 23 and the emitter region 24.

As enclosed by a broken lines in FIG. 2, the lateral-type PNP bipolar transistors 11 and 12 in the current mirror circuit, each use the well region as the base region 22, and comprise the collector regions 23, the emitter regions 24 and the gate electrodes 26 formed via the insulation films 25.

In the above embodiment, the emitter region is used commonly to two collector regions 23, and a gate electrode 26 is provided between each of the collector regions 23 and the emitter region 24. With this structure, two bipolar transistors (bipolar transistors 11 and 12) can be formed in one well region 22, thus enhancing the integration of the circuit. Further, with the structure in which the two transistors 11 and 12 are formed in a common well region 22, the base terminals of these two transistors 11 and 12 are connected to each other by the buried layer 27, and therefore the wiring is no longer necessary on the semiconductor substrate 21. Furthermore, the emitter region 24 is common to the two transistors 11 and 12, and it suffices if there is one wiring line for connecting the emitter region to the power source. Therefore, the step for forming such wiring can be omitted, the space on the substrate, occupied by wiring can be saved, and the restriction in terms of designing a semiconductor device can be relieved.

The diode 13 serving as bias means to the gate electrodes 26 formed between each of the collector regions 23 and the emitter region 24, although only represented by the symbol, may be formed in the form of PN junction, by introducing an N-type impurity of a conductivity type opposite to that of the substrate, to an area adjacent to the region in which the two transistors 11 and 12 are formed. Then, electrodes are formed for this PN junction, and the anode electrode is connected to the collector terminal 23 of the transistor 11, whereas the cathode electrode is connected to the gate electrode 26 of each of the transistors 11 and 12. In the case where a resistor is used as the bias means, the resistor element may be formed by the following manner. That is, a polycrystal silicon film is formed by, for example, the CVD method, and an impurity of a predetermined concentration is introduced to the polycrystal silicon film to achieve a predetermined resistance value. Alternatively, the resistor element may be formed in the following manner. That is, an impurity of a conductivity type, having a predetermined concentration, is introduced into a predetermined region of the semiconductor substrate.

The above embodiment discusses a P-type MOS transistor and a PNP-type transistor as an example; however, as shown in FIGS. 9 and 10, it is possible to use an N-type transistor and an NPN-type transistor, of a conductivity type opposite to the above. FIG. 9 and FIG. 10 correspond to FIG. 1 and FIG. 2, respectively. Further, as shown in FIG. 11, with a resistor element 28 connected between the transistors 11 and 12 and the power source $V_{DD}$, a small current can be generated, or the variation of the electrical characteristics of the element can be suppressed, as in the conventional technique. Furthermore, in the above embodiment, the emitter region 24 is a region common to the transistors 11 and 12; however it is also possible to provide a separate emitter region 24 for each of the transistors 11 and 12, as shown in FIG. 12.

According to the present invention, with regard to the transistors used in the current mirror circuit, the influence of the base current can be neglected even in a region where the operation current value is large. Therefore, the mirror coefficient can be maintained high and a compensation circuit or the like is not necessary. Since no compensation circuit or the like is not necessary, the number of elements for constituting the circuit is small. Further, since the current driving performance is high, the number of element can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit having a current mirror circuit, said current mirror circuit comprising:

first and second lateral type bipolar transistors having a base region of a first conductivity type, an emitter region of a second conductivity type formed in a surface region of the base region, first and second collector regions of the second conductivity type formed in the surface region of the base region separately from the emitter region, and first and second control electrodes formed via an insulation film on the surface region of the base region located between the emitter region and the first and second collector regions; and bias means connected between an output terminal of said first transistor and the first and second control electrodes, for providing a bias voltage to said first and second control electrodes corresponding to an output current flowing through said output terminal of said first transistor, so that voltages on said first and second control electrodes change in accordance with the output current flowing through said output terminal of said first transistor, whereby current amplification factors of said first and second transistors are increased;

wherein the output current of the first transistor is used as a reference current and the output current of the second transistor is used as a current source.

2. A semiconductor integrated circuit having a current mirror circuit according to claim 1, wherein the means for applying the bias voltage is connected between an output terminal of the first transistor and the control electrode of the first and second transistors.

3. A semiconductor integrated circuit having a current mirror circuit according to claim 2, wherein the bias means is an element for dropping an output voltage of the first transistor in accordance with the reference current.

4. A semiconductor integrated circuit having a current mirror circuit according to claim 3, wherein the means for applying the bias voltage is a resistor, a diode, or a combination thereof.

5. A semiconductor integrated circuit having a current mirror circuit according to claim 1, wherein the bias voltage varies a channel width formed in the base region located between the emitter region and the first and second collector regions of the first and second transistors.

6. A semiconductor integrated circuit having a current mirror circuit according to claim 1, wherein the base region of the first and second transistors is a well formed in a semiconductor substrate of the second conductivity type.

7. A semiconductor integrated circuit having a current mirror circuit according to claim 6, wherein the emitter region comprises first and second emitter regions of the first and second transistors.

8. A semiconductor integrated circuit having a current mirror circuit, the current mirror circuit comprising first and second bipolar transistors having a base region of a first conductivity type, an emitter region of a second conductivity type formed in a surface region of the base region, and first and second collector regions of the second conductivity type formed in the base region separately from the emitter regions, one of the emitter region and the collector region of each of the first and second transistors constituting an input terminal, and the other one of the emitter region and collector region constituting an output terminal, means connecting the output terminal of the first transistor to the base region of the first transistor, first and second control electrodes each formed via an insulating film on the surface region of the base region between the emitter region and the collector region of each of the first and second transistors, bias means connected between the output terminal of said first transistor and the first and second control electrodes for providing a bias voltage to said first and second control electrodes corresponding to an output current flowing through said output terminal of said first transistor, so that voltages on said first and second control electrodes change in accordance with the output current flowing through said output terminal of said first transistor, whereby current amplification factors of said first and second transistors are increased, means for providing an output current of the first transistor as a reference current, and means for providing an output current of the second transistor as a current source.

9. A semiconductor integrated circuit having a current mirror circuit, comprising:

- a first region of a first conductivity type formed in a semiconductor substrate of a second conductivity type;
- a second region of the second conductivity type formed in a surface region of the first region;
- a third region of the second conductivity type formed in the surface region of the first region
- a fourth region of the second conductivity type formed in the surface region of the first region between the second and third regions and separately from the second and third regions;
- a first control electrode formed with a first insulating film between the second and fourth regions and on the surface of the semiconductor substrate;
- a second control electrode formed with a second insulating film between the third and fourth regions and on the surface of the semiconductor substrate;
- a bias element;
- a load element;
- first wiring connecting the second region to the first region;
- second wiring connecting the first wiring to an input terminal of the bias element;
- third wiring connecting an output terminal of the bias element to an input terminal of the load element;
- fourth wiring connecting an output terminal of the load element to an output voltage;
- fifth wiring connecting the output terminal of the bias element to the first control electrode;
- sixth wiring connecting the output terminal of the load element to the first control electrode;
- seventh wiring connecting the fourth region to an input voltage; and
- eighth wiring connected to the third region,
- wherein said bias element is connected between the second region and the first and second control electrodes, for providing a bias voltage to said first and second control electrodes corresponding to an output current flowing through said second region so that voltages on said first and second control electrodes change in accordance with the output current flowing through said second region.

10. A semiconductor integrated circuit comprising:

- a first transistor circuit constituted of a first bipolar transistor connected in parallel with a first field effect transistor, a first current terminal, a second current terminal, a back bias terminal, and a gate terminal, said first current terminal being connected to a power supply node, and said back bias terminal being connected to said second current terminal,
- a second transistor circuit constituted of a second bipolar transistor connected in parallel with a second field effect transistor, a first current terminal, a second current terminal, a back bias terminal, and a gate terminal, said first current terminal of said second transistor circuit being connected to said power supply node, and said back bias terminal of said second transistor circuit being connected to said back bias terminal of said first transistor circuit, and
- a bias element connected between said second current terminal of said first transistor circuit and said gate terminal of said first transistor circuit and connected between said second current terminal of said first transistor circuit and said gate terminal of said second transistor circuit, for supplying a bias voltage corresponding to an output current of said first transistor circuit to said gate terminals of said first and said second transistor circuits.

11. A semiconductor integrated circuit according to claim 10, wherein said bias element comprises a diode.

12. A semiconductor integrated circuit according to claim 10, wherein said bias element comprises a resistor.

13. A semiconductor integrated circuit according to claim 10, wherein said bias element comprises a circuit constituted of a diode and a resistor.

14. A semiconductor integrated circuit according to claim 10, wherein said back bias terminal of said first transistor circuit is connected to a base of said first bipolar transistor and a back gate of said first field effect transistor, and said back bias terminal of said second transistor circuit is connected to a base of said second bipolar transistor and a back gate of said second field effect transistor.

15. A semiconductor integrated circuit according to claim 14, wherein said load element comprises a circuit constituted of a resistor and a diode.

16. A semiconductor integrated circuit according to claim 10, further comprises a load element connected between said bias element and a reference potential node.

17. A semiconductor integrated circuit according to claim 16, wherein said load element comprises a resistor.

18. A semiconductor integrated circuit according to claim 16, wherein said load element comprises a diode.

* * * * *

UNITED STATES PATENT AND TRADEMARK OFFICE
CERTIFICATE OF CORRECTION

PATENT NO. : 5,834,814
DATED : November 10, 1998
INVENTOR(S) : Takao ITO

It is certified that error appears in the above-identified patent and that said Letters Patent is hereby corrected as shown below:

Claim 8, Col. 9, line 18, after "electrodes", insert --,--.

Claim 9, Col. 9, line 36, after "region", insert --;--.

Claim 9, Col. 10, line 8, after "region", insert --,--.

Signed and Sealed this

Twenty-fourth Day of August, 1999

*Attest:*

Q. TODD DICKINSON

*Attesting Officer*     *Acting Commissioner of Patents and Trademarks*